United States Patent [19]

Rao et al.

[11] 4,070,653
[45] Jan. 24, 1978

[54] RANDOM ACCESS MEMORY CELL WITH ION IMPLANTED RESISTOR ELEMENT

[75] Inventors: G. R. Mohan Rao, Houston; Gerald R. Rogers, Sugarland; David J. McElroy, Houston, all of Tex.

[73] Assignee: Texas Instruments Incorporated, Dallas, Tex.

[21] Appl. No.: 700,989

[22] Filed: June 29, 1976

[51] Int. Cl.² .............................................. G11C 11/40
[52] U.S. Cl. .................................. 365/222; 307/238; 365/148; 365/177; 365/178
[58] Field of Search ...... 340/173 R, 173 DR, 173 SP, 340/173 CA; 307/238

[56] References Cited

U.S. PATENT DOCUMENTS

| | | | |
|---|---|---|---|
| 3,693,170 | 9/1972 | Ellis et al. | 340/173 FF |
| 3,706,891 | 12/1972 | Donofrio et al. | 340/173 CA |
| 3,876,993 | 4/1975 | Cavanaugh | 340/173 DR |
| 3,955,181 | 5/1976 | Raymond, Jr. | 340/173 DR |

OTHER PUBLICATIONS

P. Pleshko, "Low–Power Flip–Flop," Oct. 1966, pp. 553–554, IBM Technical Disclosure Bulletin, vol. 9, No. 5.

Primary Examiner—Stuart N. Hecker
Assistant Examiner—Donald McElheny
Attorney, Agent, or Firm—James T. Comfort; John G. Graham

[57] ABSTRACT

A self-refresh MOS RAM cell uses a resistor element made by an ion implant step compatable with a self-aligned N-channel silicon-gate process. The resistor element is beneath the field oxide in the finished device, although the implant step is prior to formation of the thick oxide. The cell employs two transistors and a gated capacitor, connected in a manner such that a stored "1" switches the implanted resistor to a high impedance state, while a stored "0" maintains the resistor in a relatively low resistance state.

13 Claims, 16 Drawing Figures

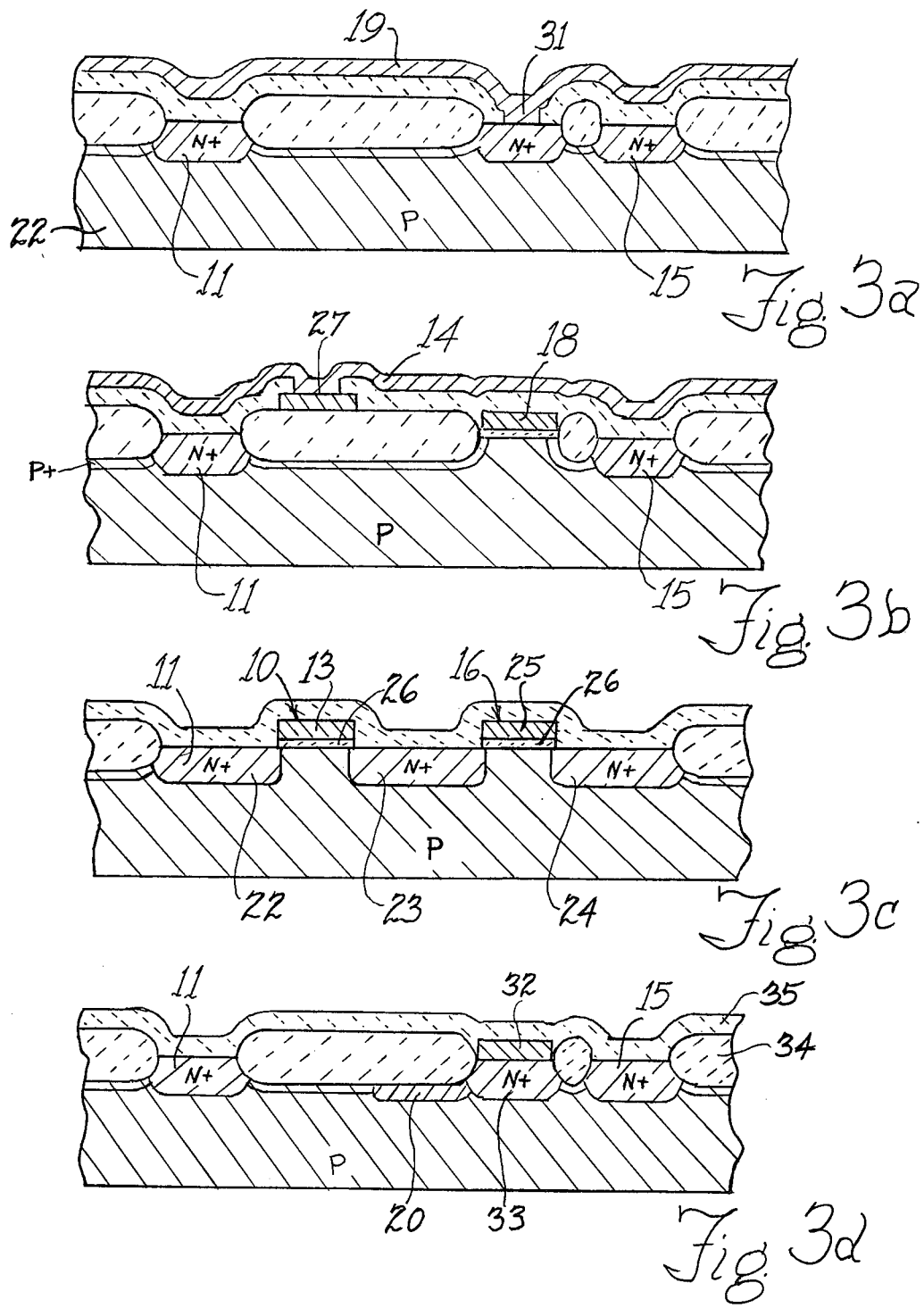

RANDOM ACCESS MEMORY CELL WITH ION IMPLANTED RESISTOR ELEMENT

BACKGROUND OF THE INVENTION

This invention is directed to semiconductor memory devices and methods of making such devices, and more particularly to an improved MOS memory cell of the random access type.

Semiconductor memory devices are widely used in the manufacture of digital equipment particularly minicomputers and microprocessor systems. MOS RAMs have been selected for use in an increasing portion of this field. The number of bits in a chip has increased dramatically, going from the industry standard of 1024 in 1972 to 4096 today, and 16384 bit device will soon be in volume production. A "4K" or 4096 bit MOS RAM is described in U.S. Pat. No. 3,940,747, issued Feb. 24, 1976 to Kuo and Kitagawa, assigned to Texas Instruments. 16K RAMs are described in Electronics, Feb. 19, 1976, pp. 116–121 and May 13, 1976, pp. 81–86. These high density devices use one-transistor dynamic memory cells which have the advantage of very small size, but require sense amplifiers capable of distinguishing a few hundred millivolts, and dissipate considerable power in large arrays, and of course suffer from the disadvantage of requiring external refresh systems. The arrays must be addressed periodically to restore the data, since the stored voltages will leak off the capacitors in the memory cells. This imposes both time and hardware burdens on the system. Static memory cells of the type set forth in copending application Ser. No. 691,252, filed May 28, 1976, by G. R. Mohan Rao, assigned to Texas Instruments, avoid the need for refresh, but at the expense of larger cell size and increased power dissipation. Various types of "self-refreshing" cells have been proposed, one example of which is shown in Digest of Technical Papers, 1976 IEEE Solid State Circuits Conference, p. 132, on Automatic Refresh Dynamic Memory. Another is shown in U.S. Pat. No. 3,955,181, issued May 4, 1976 to Joseph H. Raymond, Jr., for Self-Refreshing Random Access Memory Cell, assigned to Texas Instruments. These cells provide apparently static operation in that refresh is accomplished without addressing the cells. Prior self-refresh cells, however, have exhibited either large cell size or excessive power dissipation, neither of which is compatable with high density memories of the 4K or 16K variety.

It is a principal object of this invention to provide improved memory cells in semiconductor integrated circuits. Another object is to provide an improved RAM cell for MOS memory devices. An additional object is to provide small area, self-refreshing memory elements in semiconductor integrated circuits, particularly with lower power dissipation.

SUMMARY OF THE INVENTION

In accordance with this invention, a memory cell is provided which includes a read/write transistor which is connected between the bit line and a storage node, this transistor being controlled by the address line. The storage node is connected to a voltage supply through a refresh transistor, and the gate of this transistor is clocked at a very slow rate. An implanted resistor connects this gate to the storage node, and this resistor switches between a high impedance state and a low impedance state depending upon whether a "1" or a "0" is stored. The resistor is provided by an ion implanted region located beneath a thick silicon oxide layer grown after the implant step. In an N-channel MOS process, the oxide layer would be "field oxide". In making the resistor, first the area which is to form the resistor element is implanted, using an appropriate mask, then field oxide is grown. The upper surface of the implanted region is consumed as the field oxide is grown; the remaining implanted material is of very high resistivity. For example, reproducible results at 1 megohm per square have been achieved, as set forth in said pending application Ser. No. 691,252.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 3a–3h are elevation views in section of the cell of FIG. 2, taken along the lines a—a, b—b, c—c, d—d, e—e, f—f, g—g and h—h, respectively;

DETAILED DESCRIPTION OF SPECIFIC EMBODIMENT

Figure 1:
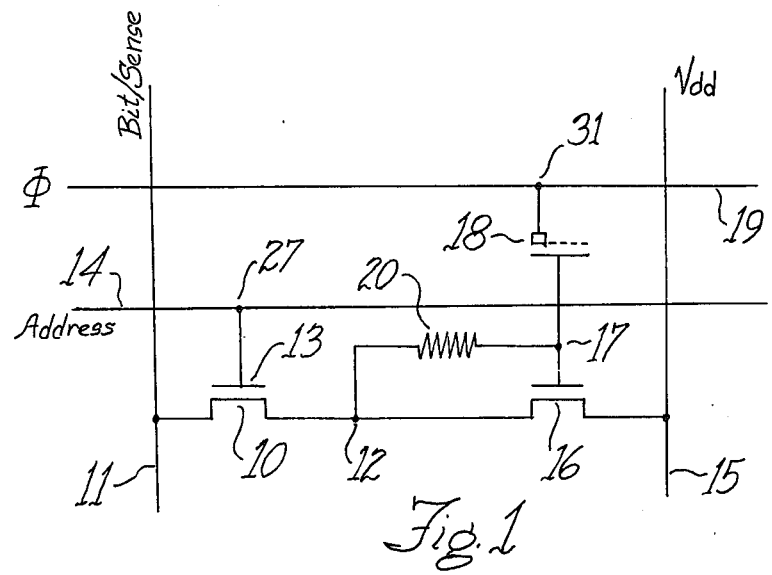
FIG. 1 is an electrical schematic diagram of the RAM cell of the invention.
Figure 2:
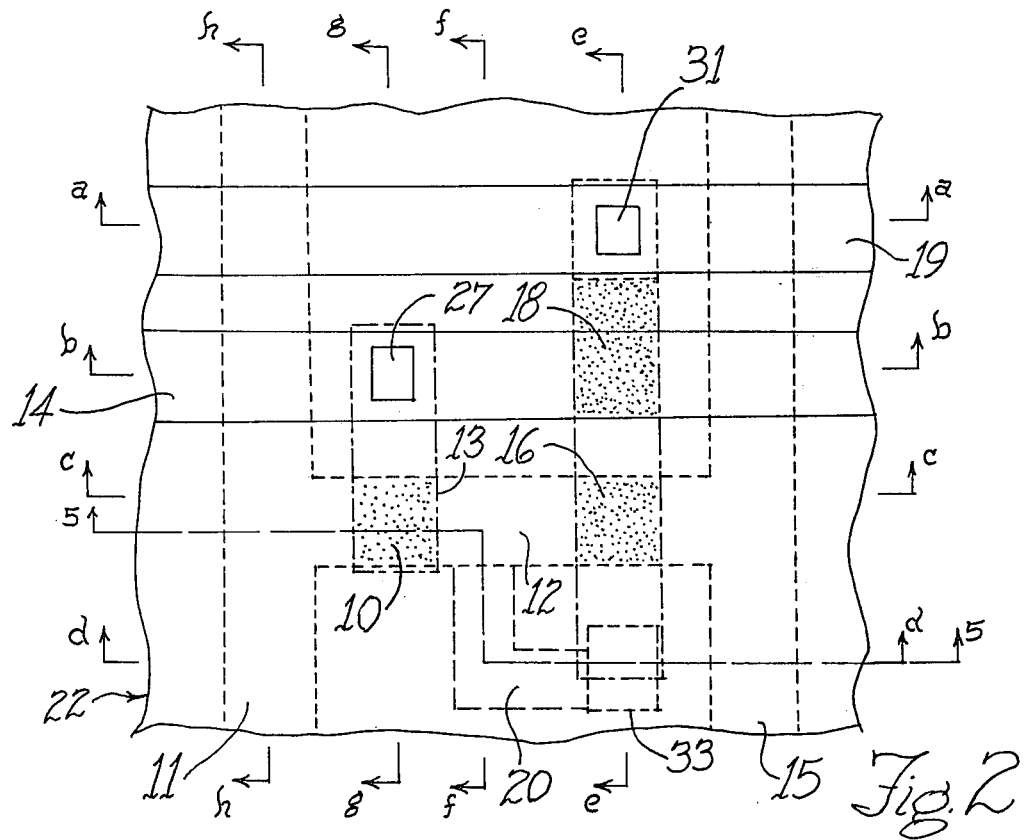
FIG. 2 is a greatly enlarged plan view of a small portion of a semiconductor chip showing the physical layout of the RAM cell of FIG. 1 using the implanted resistor of the invention.

Referring to FIG. 1, a self-refreshing random access memory cell according to the invention is illustrated in schematic form, and the same cell is shown in an MOS integrated circuit layout in FIG. 2, where like parts have the same reference characters. The cell includes a first transistor 10 which has its source-drain path connected in series between a sense or bit line 11 and a node 12, and has its gate 13 connected to a write or address line 14. The device is formed in N-channel technology, and typical logic levels are zero or Vss (ground) for logic "0" and about +12v. or near Vdd for logic "1". Thus, when the address line 14 is high, the transistor 13 would be rendered conductive, and the data on the bit or sense line 11 would be transferred to the node 12 for a write operation, or the voltage or charge on the node 12 would be transferred to the sense line 11 for a read operation. The node 12 is connected to a constant voltage or Vdd line 15 by the source-drain path of a transistor 16, and the gate of the transistor 16 or a node 17 is connected to one electrode of a gated capacitor 18. One electrode of the gated capacitor is connected to a clocked line 19. The repetition rate of the clock voltage on the line 19 is much less than the cycle time or access time of the memory device, since the clock on the line 19 merely functions to refresh the potential on the node 17. For example, the clock may be at perhaps 1KHz, up to about 100 KHz. The critical element of the cell is an implanted resistor 20 which connects the node 17 to the node 12. The node 12, a diffused N+ region in the semiconductor material, is the storage node.

The resistor 20 is buried under field oxide as set forth in copending application Ser. No. 691,252, filed May 28, 1976 by G. R. Mohan Rao and assigned to Texas Instruments. This device exhibits a very high sheet resistance, and exhibits a change in resistance with change in source voltage.

In operation of the cell of FIGS. 1 and 2, it may be noted that the transistor 16 is off so long as the voltage between nodes 12 and 17 is less than the threshold voltage Vt (usually about ⇌0.8v.). When a logic "0" is written into the cell, the node 12 is at Vss, and will stay at Vss or logic "0" because the transistor 16 is kept off; any tendency for the gate or node 17 to charge toward Vt will be dissipated through the resistor 20, whose rsistance will be at its minimum because the voltage at each end of the resistor is low. On the other hand, when a logic "1" is written into the cell, the node 12 charges at once to about (Vdd-Vt) or (Vdd-2Vt) which is about +10v. through the transistor 10 which is turned full on by a positive voltage on the address line 14. The implanted resistor 20 has a cut off voltage of about +5 to +7v. The node 17 charges to a value of about (5 to 7v. + Vφ). If the charge on the node 12 leaks, the voltage between the node 17 and the node 12 is still greater than Vt, and so the transistor 16 turns on, charging the node 12 to Vdd from the line 15. If the charge on the node 17 leaks, the clock φ will charge it to a level Vφ, and if Vφ is greater than the voltage on the node 12 or a logic 1, the voltage on the node 12 will stay high. Note that when the voltage on the node 17 is high, the gated capacitor 18 will be at its high value because the silicon beneath the gate oxide will be depleted or inverted, producing a wide-area lower plate. However, when a "0" is stored, the voltage on the upper plate, or the node 17, is low, and the capacitance coupling is very low, and almost no voltage is coupled from φ line 19 to the node 17 when the clock φ goes high.

Figure 3E:
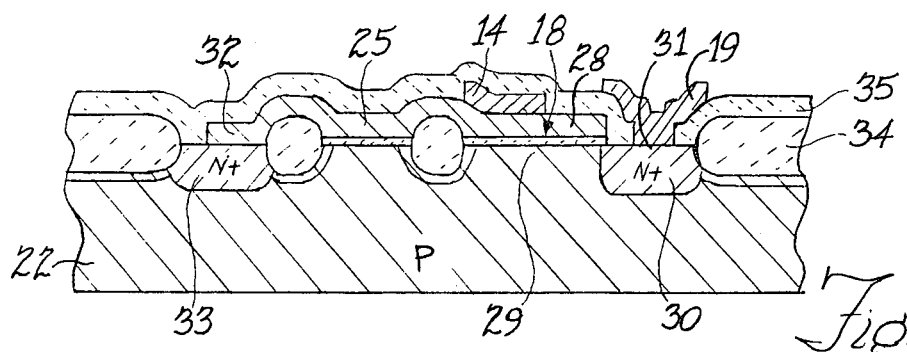
Figure 3F:
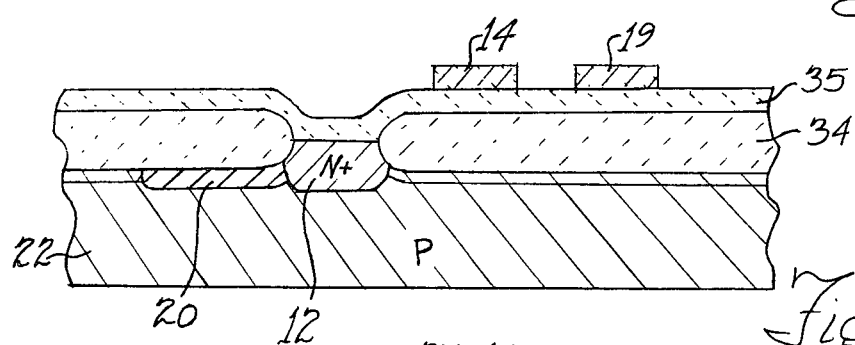
Figure 3G:
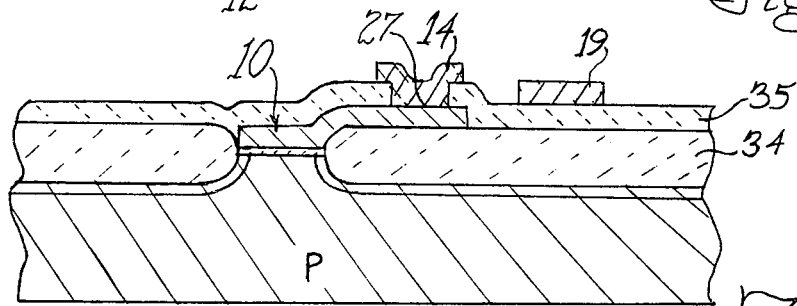
Figure 3H:
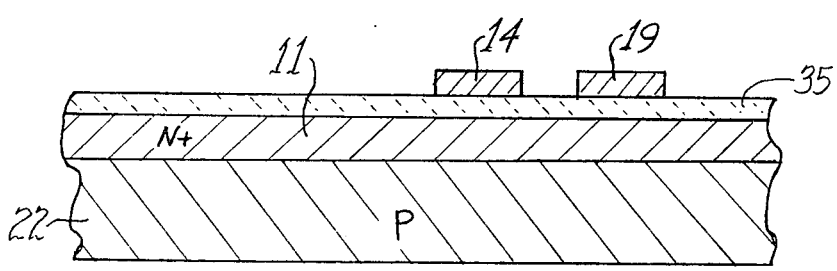

Referring now to FIG. 2, and its associated sectional views in FIGS. 3a to 3h, the structure of a RAM cell made according to the invention will be appreciated. Although only one cell is shown, usually an array of 1024, 4096, or 16384 cells is made on a single chip of silicon, along with address buffers, decoders, input/output controls, and clock generator circuits to support the memory array. So, the cell of FIGS. 2 and 3a–3h is formed in a small part of a P-type semiconductor chip 22. The size of the cell in the plan view of FIG. 2 is about one or two mils on a side. The bit/sense line 11 and the Vdd supply line 15 are elongated N+ diffused regions, while the address line 14 and the φ line 19 are strips of deposited aluminum. As seen in FIG. 3C the transistors 10 and 16 are formed by diffused N+ regions 22, 23 and 24 which create the sources and drains, these being extensions of the N+ regions of the line 11 and 15. The gates of the transistors 10 and 16 are formed by polysilicon layers 13 and 25 which overlie areas of thin oxide 26. The polysilicon gate layer 13 extends beneath the metal strip of the line 14 where contact between the address line and the gate is made at a contact area 27. As seen in FIG. 3e, the capacitor 18 is formed by an area 28 of polysilicon which is an extension of the same layer 25 which formed the gate of the transistor 16. Beneath the polysilicon area 28 is an intermediate layer of the thin oxide coating 26, and an area 29 of the original P-type silicon surface forming the lower plate of the capacitor 18. Connection to the lower plate is made by an N+ diffused region 30 which is contacted by the metal line 19 at a contact area 31. When the voltage at the area 28 is about +Vdd, a depletion or inversion layer is formed at the area 29, connecting to the N+ region 30 and creating a large value capacitor; when the voltage on the area 28 is at Vss, the area beneath it is not inverted and the capacitive coupling between the area 28 and the region 30 is quite small. The polysilicon layer of the gate 25 also extends over to an area 32 where contact to a diffused N+ region 33 is made. The region 33 serves as one terminal of the resistor 20, and the region 23 serves as the other terminal. The resistor 20 is buried beneath a field oxide layer 34 which covers the entire face of the chip except where diffused N+ regions are formed, where contacts are made, or where thin oxide 26 is used. Another layer 35 of silicon oxide covers the chip to provide insulation between various conductive materials such as polysilicon and metal; this layer 35 is thick enough to reduce the tendency for unwanted MOS transistors to be created, and to reduce the capacitance between conductors. In a layout of a large array of the cells of FIG. 2, the ajacent cell on the right would share the Vdd line 15 so the cell would be reflected about the line 15; in like manner, the adjacent cell above this cell would share the φ line 19, so the cell would be reflected about the line 19. A packing density of 4096 cells in a chip of about 150 to 200 mils on a side may be achieved.

Figure 4:
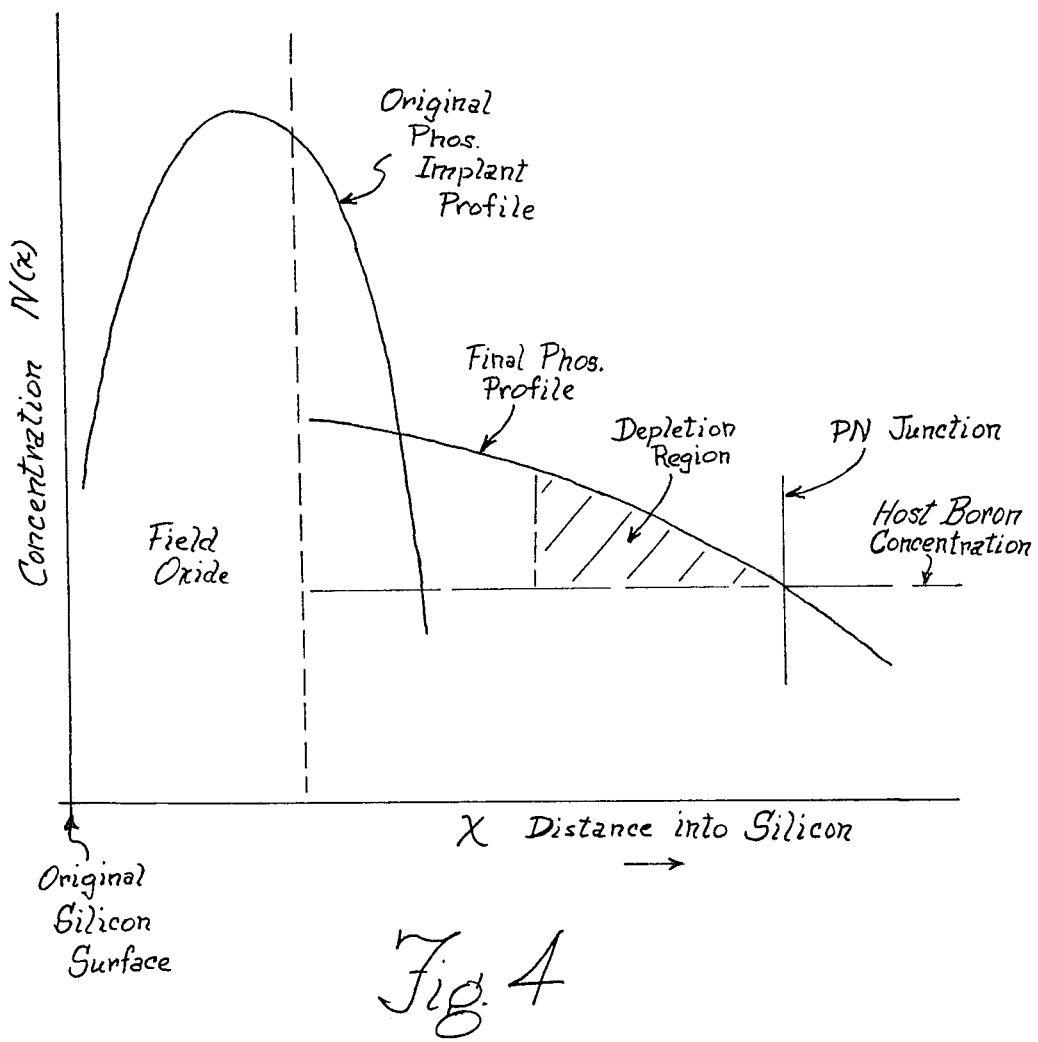
FIG. 4 is a graphic representation of phosphorus concentration as a function of distance for an implanted resistor.

The resistor 20 is a phosphorus implanted resistor, in which sheet resistivity ρs may be expressed as $$\rho s = \frac{1}{\nu \mu_n N} \text{ or } \int_o^x \frac{1}{\nu \mu_n N(x) \, dx}$$

where $\mu n$ is the electron mobility (which is about 500 cm sq. per volt-sec for standard material), N is concentration of phosphorous impurity atoms per cm cubed, and $\nu$ is unit charge. A graphic illustration of concentration N(x) as a function of distance X into the silicon surface is shown in FIG. 4. For an implant dosage of 1.0 × 10¹¹ atoms per cm sq.

$$\rho s = \frac{1}{1.6 \times 10^{-19} \times 500 \times 10^{11}} = 125 \, K \text{ ohm/square}$$

This is prior to growing the field oxide 34 over the resistor region 20. When field oxide is grown, the implanted phosphorus is driven deeper into the native silicon, and resistances are achieved of ten times greater, or about one megohm per square, according to the invention set forth in pending application Ser. No. 691,252. Phosphorus will redistribute under the field oxide as seen in FIG. 4, and also some will be consumed by the oxide growth. In the formula for ρs, N will be lower, and the thickness dimension is changed. The resistor 20 resembles a junction field effect transistor, and its resistance will be dependent upon substrate bias and source voltage. Often N-channel silicon-gate integrated circuits have a bias of −3 or −5 volts on the substrate, as is standard practice. The effect on the resistor 20 would be an increase in resistance as substrate bias increased because the "channel" or current path will tend to be depleted of minority carriers, electrons in this case, as the junction is reverse biased. "Source" bias or Vs has the same effect. By source bias is meant the voltage across the resistor from one end (the node 17) to the other (the node 12) or the voltage on the nodes 12 and 17. For example, in the circuit of FIG. 1, when a logic "1" is stored the voltage on nodes 12 and 17 is near Vdd (the current through and drop across the resistor are minimal); thus voltage across the PN junction underlying the resistor virtually cuts off or pinches off the resistor current path, making the resistance very high, perhaps 10 Meg ohm. When a zero is stored, the voltages on the nodes 12 and 17 are near Vss, the depletion region does not extend into the resistor 20, and its resistance is low. High resistance in the stored "1" state is reduced power dissipation in charging the node 17 from the V$\phi$ supply.

In reading out a stored zero, the transistor 16 is off, and so the bit line 11 would not be changed from the node 12; however, in reading out a stored "1", the transistor 16 will be on, and the bit line 11 will be connected via the source-drain paths of transistors 10 and 16 to the Vdd line 15, providing almost a full logic level, perhaps (Vdd — 2Vt) or about 10v., in contrast to conventional dynamic one-transistor cells which produce about 100 to 200 millivolt. The bit lines 11 in the memory array need not be precharged, but instead should be discharged to Vss at the beginning of a read cycle. The cycle time for the memory array would be perhaps 500 nanosecond, compared to the V$\phi$ clock timing which is about 1 millisecond to 10 microseconds. That is, the V$\phi$ clock is about a factor of 20 to 2000 slower than the access time of the memory. The voltage level of V$\phi$ is preferably at least one Vt higher than Vdd; the larger V$\phi$ then the slower it can be. The characteristics of the resistor 20 are selected such that its cut-off or pinch-off voltage is less than Vdd. This is determined by impurity concentration and junction depth. The size of the resistor 20 is about 0.2 mil to 0.3 mil in width and about 0.4 to 0.7 mil in length, as seen in plan view of FIG. 2, and about 2000 to 8000 A in "effective" thickness as seen in section in FIGS. 3d or 3f. Diffusion of phosphorus is somewhat anomalous, so the precise thickness is not well known. Because of the concentration profile of FIG. 4, the depletion region caused by reverse biasing the $p$n junction can extend all the way to the silicon to silicon oxide interface and thus cut-off or pinch-off the device. As noted, this occurs at about 5 to 7v.

Referring now to FIGS. 5a–5e, a process for making the N-channel, silicon-gate, self-aligned MOS integrated circuit device of FIGS. 2 and 3a–3h will be described. FIGS. 5a–5e represent a sectional view along the line 5—5 of FIG. 2, chosen to illustrate formation of a transistor and the resistor 20. The starting material is a slice of P-type monocrystalline silicon, perhaps 3 inches in diameter and 20 to 40 mils thick, cut on the <100> plane, of a resistivity of about 6 to 8 ohm-cm. In FIGS. 2, 3 or 5, the chip or bar 22 represents a very small part of the slice, perhaps 2 or 3 mils wide. After appropriate cleaning, the slice is oxidized by exposing to oxygen in a furnace at an elevated temperature of perhaps 1000° C to produce an oxide layer 38 of a thickness of about 1000A. Next, a layer 39 of silicon nitride of about 1000A thickness is formed by exposing to an atmosphere of silane and ammonia in an rf plasma reactor. A coating 40 of photoresist is applied to the entire top surface of the slice, then exposed to ultraviolet light through a mask which defines the desired pattern, and developed. This leaves an area 41 where nitride is to be etched away by a nitride etchant which removes the exposed part of the nitride layer 39 but does not remove the oxide layer 38 and does not react with the photoresist 40.

The slice is now subjected to an ion implant step, whereby phosphorus atoms are implanted in an area 42 of silicon not covered by photoresist 40 and nitride 39 to create the resistor. The photoresist could have been removed, but preferably is left in place as it also masks the implant. The oxide layer 38 is left in place during the implant because it prevents the implanted phosphorus atoms from out-diffusing from the surface during subsequent heat treatment. This implant is at a dosage of about $5 \times 10^{10}/cm^2$ at 70 to 150 KeV. The selection of energy level used will provide a control over the cut-off voltage, with higher energy level providing a higher cut-off.

As will be seen, the region 42 does not exist in the same form in the finished device, because some of this part of the slice will have been consumed in the field oxidation procedure.

Next, the photoresist coating 40 is removed and another photoresist coating 43 is applied over the entire slice, then exposed to UV light through a mask which exposes everything that is to become the transistors, N+ diffused regions, and capacitors. Upon developing, unexposed photoresist is removed in areas 44 in FIG. 5b. The region 42 where resistor region 20 will be created is covered. The nitride layer 39 is etched away in the areas 44, the oxide 38 is left in place as before, and then the slice is subjected to a boron implant at 100 KeV at a dosage of about $4 \times 10^{12}/cm^2$. Boron is an impurity which produces P-type conductivity, so more heavily doped P+ regions 45 will be produced in the surface. The remaining photoresist 43 then would be removed.

As set forth in copending patent application Ser. No. 648,593, filed Jan. 12, 1975 by G. R. Mohan Rao, assigned to Texas Instruments, the next step in the process is to subject the slice to a heat treatment or annealling step, during which the slice is maintained at a temperature of about 1000° C for perhaps approximately 2 hours in an inert atmosphere, preferably nitrogen. This step causes the implanted boron and phosphorus concentrations to change markedly, which has desirable effects aside from reduction in bulk damage in the crystal structure. The P+ region 45 as well as the N region 42 have now penetrated deeper into the silicon surface.

Figure 5A:
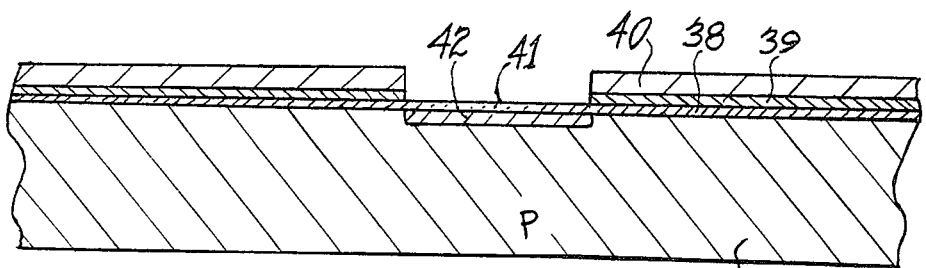
FIGS. 5a–5e are elevation views in section of the semiconductor device of FIGS. 2 and 3a–3h, at successive states in the manufacturing process, taken along the line 5—5 in FIG. 2.
Figure 5B:
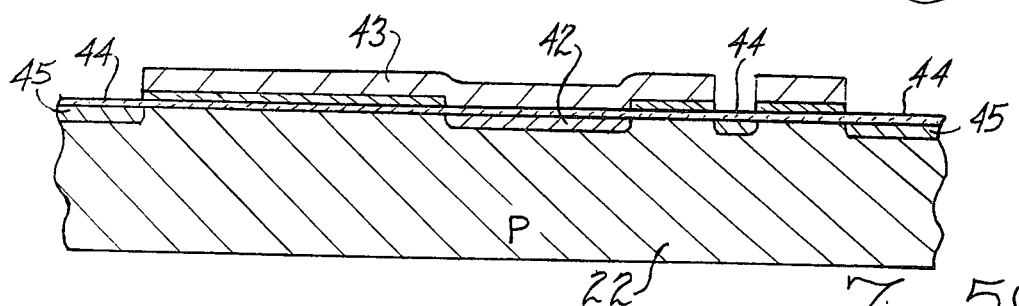
Figure 5C:
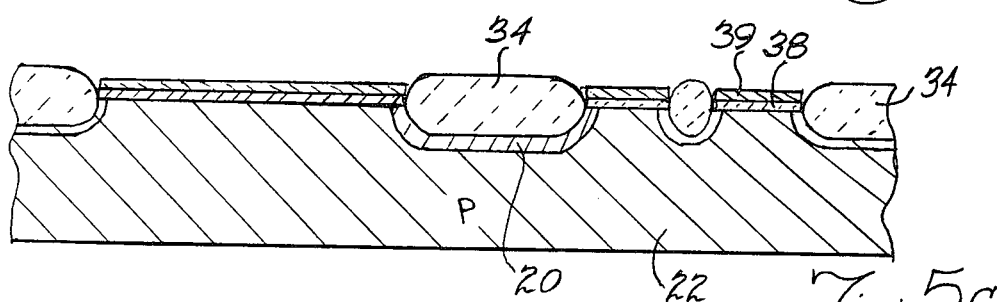

The following step in the process is formation of field oxide 34, which is done by subjecting the slices to steam or an oxidizing atmosphere at about 900° C for perhaps 10 hours. This causes a thick field oxide region or layer 34 to be grown as seen in FIG. 5c, and this region extends into the silicon surface because silicon is consumed as it oxidizes. The nitride layer 39 masks oxidation beneath it. The thickness of this layer 34 is about 8000 to 10,000A, about half of which is above the original surface and half below. The boron doped P+ regions 45 and the phosphorus doped N region 42 formed by implant and modified by the anneal step will be partly consumed, but will also diffuse further into the silicon ahead of the oxidation front. Thus, P+ "channel-stop" regions 46 and the N resistor region 20 will result which will be deeper and of more uniform and acceptable concentration at the surface compared to what would have resulted without the anneal step. Also the regions 46 and 20 will not have the extent of crystalline structure damage characteristic of prior implanted devices.

Figure 5D:
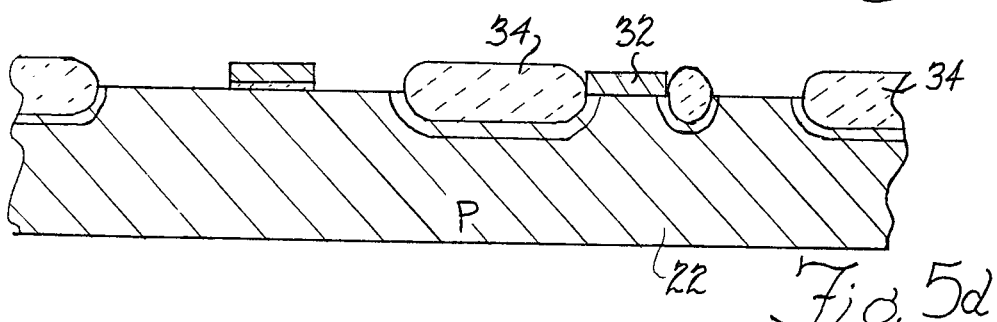

The nitride layer 30 and its underlying oxide layer 38 are removed by etching, as the next step, and another thin oxide layer 26 of about 800A is grown over the exposed areas of silicon. This layer 26 later becomes the gate insulators of the transistors and the capacitor dielectric. Windows for polysilicon to silicon contacts are patterned and etched using photoresist. A layer of polycrystalline silicon is deposited over the entire slice in a reactor using standard techniques. The polysilicon and gate oxide or thin oxide layers are next patterned by applying a layer of photoresist, exposing to ultraviolet light through a mask prepared for this purpose, developing, then etching with the remaining photoresist masking certain areas of the polysilicon. The resulting structure is seen in FIGS. 5d, where a part of the remaining polysilicon layer provides what will be the gate 13 of MOS transistor 10, and thin oxide 26 underneath it is the gate oxide of the transistor. These same layers also provide gate and gate oxide for all the other transistors on the slice, as well as capacitors, wherein the thin oxide 26 is the dielectric layer and the polysilicon layer is the upper plate of a capacitor.

Figure 5E:
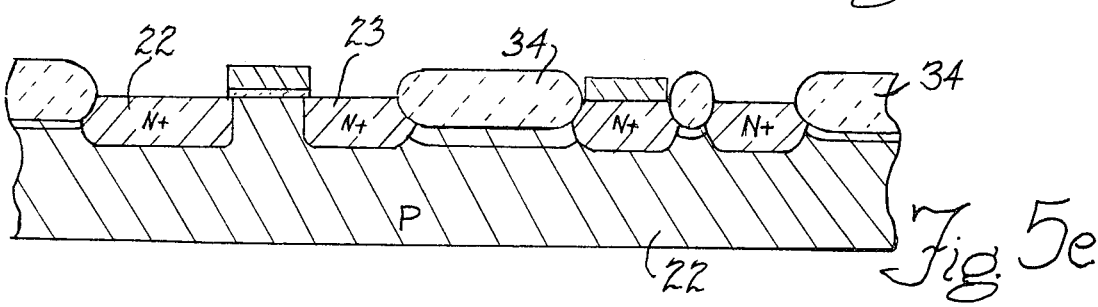

Using the thin oxide 26 and field oxide 34 as a diffusion mask, the slice is now subjected to an N+ diffusion, whereby phosphorus is diffused into the silicon slice 22 as seen in FIG. 5e to produce regions 11, 15, 22, 23, 24 and 33. Phosphorus diffuses into the exposed polysilicon, so it becomes heavily doped and very conductive. The poly does not mask the diffusion, so the region 33 is created beneath the poly. The depth of diffusion is about 8,000 to 10,000A. The N+ diffused regions function as conductors which connect the various regions together, and also function as the source or drain regions of all the MOS transistors.

As seen in FIGS. 3a–3h, fabrication of the device is continued by depositing another layer 35 of phosphorus-doped oxide. Rather than by oxidizing, this is done by a low temperature reaction process using conventional chemical vapor deposition techniques. A layer 35 of about 6,000A is produced, covering the entire slice. Subsequently, windows are opened in the oxide layer 35 in areas 27 and 31 where contact is to be made to regions of the silicon or to the polysilicon layer using photoresist masking and etching. Then, a layer of aluminum is deposited on the entire slice, and etched away using photoresist masking to provide the desired pattern of metal interconnections 14 and 19.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A semiconductor integrated circuit comprising first and second MOS transistors each having a source-drain path and a gate, the source-drain path of the first transistor being connected between a first node and a source of logic levels, the gate of the first transistor being connected to a different source of logic levels, the source-drain path of the second transistor being connected between the first node and a voltage supply, an intermittent voltage source coupled to the gate of the second transistor at a second node, and an impedance element connecting the first node to the second node, the impedance element exhibiting a low impedance state when the voltage on the first and second nodes is relatively low and exhibiting a high impedance state when the voltage on the first and second nodes is relatively high.

2. A circuit according to claim 1 wherein a gated capacitor couples the intermittant voltage source to the second node.

3. A circuit according to claim 1 wherein the impedance element is a region within the semiconductor material formed by ion implant and having a low impurity concentration.

4. A circuit according to claim 3 wherein the region which forms the impedance element is buried beneath a thick thermal oxide layer.

5. A circuit according to claim 4 wherein a gated capacitor couples the intermittant voltage source to the second node, the gate capacitor including a semiconductor region connected to the second node and functioning to invert and provide a large capacitance area when the voltage on the second node is high.

6. A storage cell comprising an address line, a data line, a storage node, a first controlled switching device having a current path connecting the data line to the storage node and being controlled by the address line, a voltage supply, a second controlled switching device connecting the storage node to the voltage supply, resistance means connecting the storage node to a refresh node, the refresh node being connected to the control element of the second switching device, and means for applying an intermittent voltage to the refresh node.

7. A storage cell according to claim 6 wherein the means for applying an intermittent voltage include capacitance means.

8. A storage cell according to claim 6 wherein the resistance means exhibits a large change in resistance when the voltage at its terminals changes from near reference potential to near the value of the voltage supply.

9. A storage cell according to claim 6 wherein the controlled switching devices are MOS transistors and the resistance means is a junction-type field effect transistor.

10. A storage cell according to claim 6 wherein the cell is within a semiconductor integrated circuit and the resistance means is formed by an elongated region in the semiconductor material of low net impurity concentration.

11. A storage cell according to claim 10 wherein the cutoff voltage of the resistance means is about 5 to 7 volts.

12. A storage cell according to claim 10 wherein the switching devices are MOS transistors and the resistance means resembles a junction field-effect transistor.

13. A storage cell according to claim 12 wherein the resistance means comprises an ion-implanted region beneath a thick, thermally-grown oxide layer.

* * * * *